(12) United States Patent
Adam et al.

(10) Patent No.: US 8,946,033 B2
(45) Date of Patent: Feb. 3, 2015

(54) MERGED FIN FINFET WITH (100) SIDEWALL SURFACES AND METHOD OF MAKING SAME

(75) Inventors: Thomas N. Adam, Slingerlands, NY (US); Keith E. Fogel, Hopewell Junction, NY (US); Jinghong Li, Poughquag, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 115 days.

(21) Appl. No.: 13/561,352

(22) Filed: Jul. 30, 2012

(65) Prior Publication Data

US 2014/0027863 A1    Jan. 30, 2014

(51) Int. Cl.
*H01L 21/336* (2006.01)
*H01L 29/66* (2006.01)
*H01L 29/78* (2006.01)

(52) U.S. Cl.
CPC ........ *H01L 29/785* (2013.01); *H01L 29/66795* (2013.01)
USPC ............. 438/300; 257/E21.409; 257/E29.255

(58) Field of Classification Search
CPC .......................... H01L 29/66477; H01L 29/78
USPC .................... 438/300; 257/E21.409, E29.255
See application file for complete search history.

(56) References Cited

U.S. PATENT DOCUMENTS

| | | | |
|---|---|---|---|
| 6,867,460 B1 | 3/2005 | Anderson et al. | |
| 7,498,265 B2 | 3/2009 | Wells et al. | |
| 7,692,254 B2 | 4/2010 | Anderson et al. | |
| 7,851,865 B2 | 12/2010 | Anderson et al. | |
| 7,906,802 B2 | 3/2011 | Baumgartner et al. | |
| 8,039,843 B2 | 10/2011 | Inaba | |
| 8,043,920 B2 | 10/2011 | Chan et al. | |
| 8,071,983 B2 | 12/2011 | Brask et al. | |
| 8,080,838 B2 | 12/2011 | Chang et al. | |
| 8,125,007 B2 | 2/2012 | Anderson et al. | |
| 8,138,035 B2 | 3/2012 | Xiong et al. | |
| 8,217,450 B1 * | 7/2012 | Yu et al. | 257/331 |
| 2010/0044758 A1 | 2/2010 | Cohen et al. | |
| 2011/0079855 A1 | 4/2011 | Chan et al. | |
| 2011/0284967 A1 | 11/2011 | Cheng et al. | |
| 2011/0298058 A1 * | 12/2011 | Kawasaki et al. | 257/401 |
| 2011/0316081 A1 | 12/2011 | Chan et al. | |
| 2012/0043610 A1 | 2/2012 | Cheng et al. | |
| 2013/0005103 A1 * | 1/2013 | Liu et al. | 438/285 |

* cited by examiner

*Primary Examiner* — David S Blum
(74) *Attorney, Agent, or Firm* — Schmeiser, Olsen & Watts; Joseph Petrokaitis

(57) ABSTRACT

A merged fin finFET and method of fabrication. The finFET includes: two or more single-crystal semiconductor fins on a top surface of an insulating layer on semiconductor substrate, each fin of the two or more fins having a central region between and abutting first and second end regions and opposite sides, top surfaces and sidewalls of the two or more fins are (100) surfaces and the longitudinal axes of the two or more fins aligned with a [100] direction; a gate dielectric layer on each fin of the two or more fins; an electrically conductive gate over the gate dielectric layer over the central region of each fin of the of two or more fins; and a merged source/drain comprising an a continuous layer of epitaxial semiconductor material on ends of each fin of the two or more fins, the ends on a same side of the conductive gate.

13 Claims, 9 Drawing Sheets

US 8,946,033 B2

MERGED FIN FINFET WITH (100) SIDEWALL SURFACES AND METHOD OF MAKING SAME

FIELD OF THE INVENTION

The present invention relates to the field of semiconductor transistors; more specifically, it relates to finFETs and methods of fabricating finFETs.

BACKGROUND OF THE INVENTION

Fin field effect transistors (finFETs) are a leading candidate to replace planer metal-oxide-silicon field effect transistors (MOSFETs). However, two issues with finFETs are: increased parasitic resistance and incomplete merging of multi-fin finFEts as the fin width is scaled down in size. Accordingly, there exists a need in the art to mitigate the deficiencies and limitations described hereinabove.

SUMMARY OF THE INVENTION

A first aspect of the present invention is a method, comprising: (a) forming two or more single-crystal semiconductor fins on a top surface of an insulating layer on semiconductor substrate, each fin of the two or more fins having a central region between and abutting first and second end regions and opposite sides, top surfaces and sidewalls of the two or more fins are (100) surfaces and the longitudinal axes of the two or more fins aligned with a [100] direction; (b) forming a gate dielectric layer on each fin of the two or more fins; (c) forming an electrically conductive gate over the gate dielectric layer over the central region of each fin of the of two or more fins; (d) removing the gate dielectric layer from at least one end region of each fin of the two or more fins to form exposed end regions of each fin of the two or more fins, the exposed end regions on the same side of the conductive gate; and after (d), (e) growing an epitaxial semiconductor material on the exposed ends of each fin of the two or more fins to form a merged source/drain.

A second aspect of the present invention is a structure, comprising: two or more single-crystal semiconductor fins on a top surface of an insulating layer on semiconductor substrate, each fin of the two or more fins having a central region between and abutting first and second end regions and opposite sides, top surfaces and sidewalls of the two or more fins are (100) surfaces and the longitudinal axes of the two or more fins aligned with a [100] direction; a gate dielectric layer on each fin of the two or more fins; an electrically conductive gate over the gate dielectric layer over the central region of each fin of the of two or more fins; and a merged source/drain comprising an a continuous layer of epitaxial semiconductor material on ends each fin of the two or more fins, the ends on a same side of the conductive gate.

These and other aspects of the invention are described below.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1C:
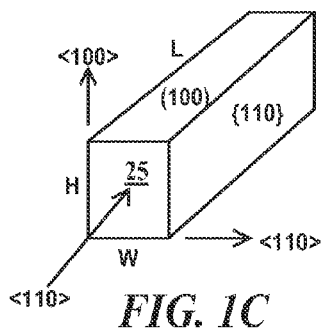
FIGS. 1A through 1D illustrate the crystal orientations of standard semiconductor on insulator wafers and the problem of incomplete merging of fins of multi-fin finFETs.

FinFETs are less susceptible to short-channel-effect (SCE) because of the ability to form double-gated devices. However, as fin sizes decrease the parasitic resistance $R_{ext}$ does not scale. Parasitic resistance may be reduced by using merged fin finFETs. However, as the fin sizes continue to decrease the merging of the fins has been found to be incomplete. The present invention uses multi-fin devices having merged source/drains to reduce the $R_{ext}$ that are fabricated from {100} surfaced single-crystal wafers were the notch is aligned to the <100> direction and the longitudinal axes of the fins are also aligned to the <100> direction. The embodiments of the present invention "merge" fins using epitaxial growth, but the crystal orientation of the fins eliminates the fast growing and self-limiting (111) facet responsible for incomplete fin merging.

In crystalline solids, the atoms, which make up the solid, are spatially arranged in a periodic fashion called a lattice. A crystal lattice contains a volume, which is representative of the entire lattice and is regularly repeated throughout the crystal. In describing crystalline semiconductor materials in the present disclosure, the following conventions are used.

The directions in a lattice are expressed as a set of three integers with the same relationship as the components of a vector in that direction. For example, in cubic lattices, such as silicon, that has a diamond crystal lattice, a body diagonal exists along the [111] direction with the [ ] brackets denoting a specific direction. Many directions in a crystal lattice are equivalent by a symmetry transformation, depending upon the arbitrary choice of orientation axes. For example, a crystal directions in the cubic lattice [100], [010] and [001] are all crystallographically equivalent. A direction and all its equivalent directions are denoted by < > brackets. Thus, the designation of the <100> direction includes the equivalent [100], [010] and [001] positive directions as well as the equivalent negative directions [-100], [0-10] and [00-1].

Planes in a crystal may also be identified with a set of three integers. They are used to define a set of parallel planes and each set of integers enclosed in ( ) parentheses identifies a specific plane. For example, the proper designation for a plane perpendicular to the [100] direction is (100). Thus, if either a direction or a plane of a cubic lattice is known, its perpendicular counterpart may be quickly determined without calculation.

Many planes in a crystal lattice are equivalent by a symmetry transformation, depending upon the arbitrary choice of orientation axes. For example, the (100), (010) and (001) planes are all crystallographically equivalent. A plane and all its equivalent planes are denoted by { } parentheses. Thus, the designation of the {100} plane includes the equivalent (100), (010) and (001) positive planes as well as the equivalent planes (-100), (0-10) and (00-1).

The finFETs of the embodiments of the present invention are fabricated from semiconductor on insulator (SOI) wafer which comprise a single-crystal semiconductor substrate layer separated from an upper single-crystal semiconductor layer by an insulating layer. The fins are formed from the upper semiconductor layer. The ends of the fins are merged by epitaxial growth. The single-crystal semiconductor substrate layer, the single-crystal upper semiconductor layer (and thus the fins) and the epitaxial material of the embodiments of the present invention may be independently selected from the group consisting of Si, SiGe, and carbon doped silicon (Si:C). Examples are shown in Table I.

TABLE I

| SUBSTRATE | UPPER LAYER AND FINS | EPITAXY |
|---|---|---|
| Si | Si | Si |
| Si | Si | SiGe |
| Si | Si | Si:C |

Figure 1B:
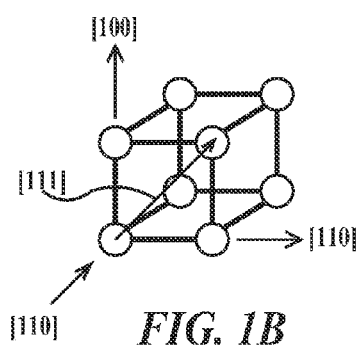
Figure 1A:
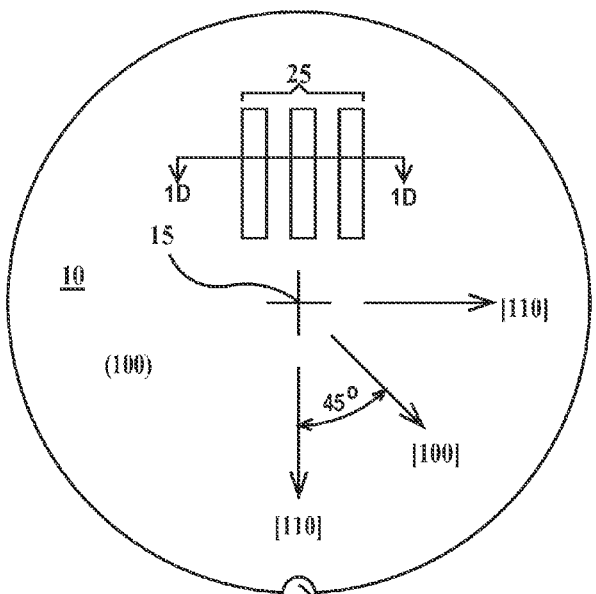
Figure 1D:
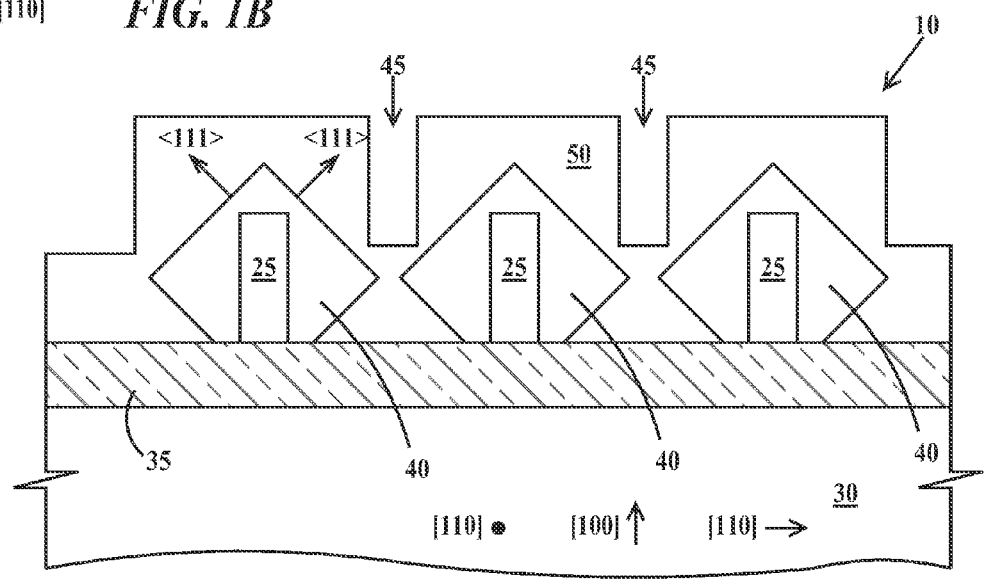

FIGS. 1A through 1D illustrate the crystal orientations of a standard SOI wafer and the problem of incomplete merging of fins of multi-fin finFETs. FIG. 1A is a top view. In FIG. 1A, a semiconductor wafer 10 has a center 15 and a notch 20. The top surface of wafer 10 is a (100) plane and a line passing through center 15 and notch 20 is along a [110] direction. There are three orthogonal [110] directions, including one into the plane of the drawing. The <110> and <100> directions are 45° apart. Three parallel fins 25 aligned in the [110] direction are illustrated. In FIG. 1B, a [111] direction is indicated as halfway (45°) from a [100] direction and a [110] direction. In FIG. 1C, fin 25 has a (100) top surface, a {110} sidewall and a longitudinal axis along the <110> direction. The height H of fin 25 is defined by the starting thickness of the upper semiconductor layer, the width W of fin 25 is defined by a combination of photolithography and sidewall spacer technology, and the length L of fin 25 is defined by photolithography. FIG. 1D is a cross-section through line 1D-1D of FIG. 1A. In FIG. 1D, SOI wafer 10 includes a semiconductor substrate layer 30 and an insulating layer 35 between layer 30 and fins 25. A strong facet has a lower surface energy than a weak facet so epitaxial growth is faster on a strong facet than a weak facet. For crystalline Si, SiGe and Si:C, epitaxial growth is fastest in the <111> direction, and slowest in the <100> direction, with growth in the <110> direction in between. Because the top surface of fins 25 are (100) and the sidewalls of fins 25 are {110} there is slower "up" growth than "side" growth in addition to the strong (111) facet that leads to arrest of epitaxial growth before fin merging is complete. In FIG. 1D, the initial growth region 40 along leads to divots 45 (as well as (111) facets) in the final epitaxial layer 50. Additionally, the fast growth causes dislocation defects in the final epitaxial layer. This incomplete merging problem has not been previously seen with 100 nm groundrule devices (i.e., the smallest device widths and spaces are 100 nm). The problem, which was unexpected, has only been discovered at about 30 nm groundrules and is a severe problem below 30 nm.

Figure 2C:
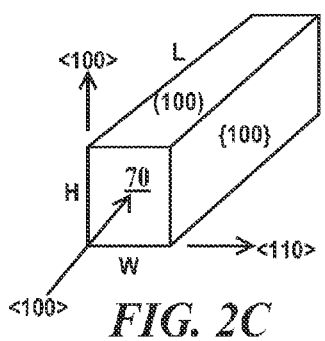
FIGS. 2A through 2D illustrate the crystal orientations of a rotated semiconductor on insulator wafers according to embodiments of the present invention resulting in the complete merging of fins of multi-fin finFETs.
Figure 2B:
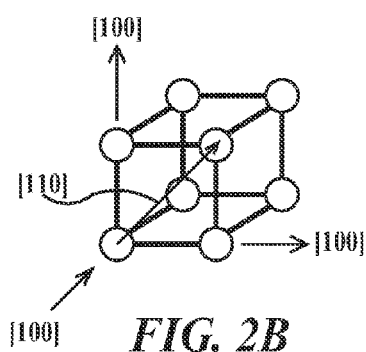
Figure 2A:
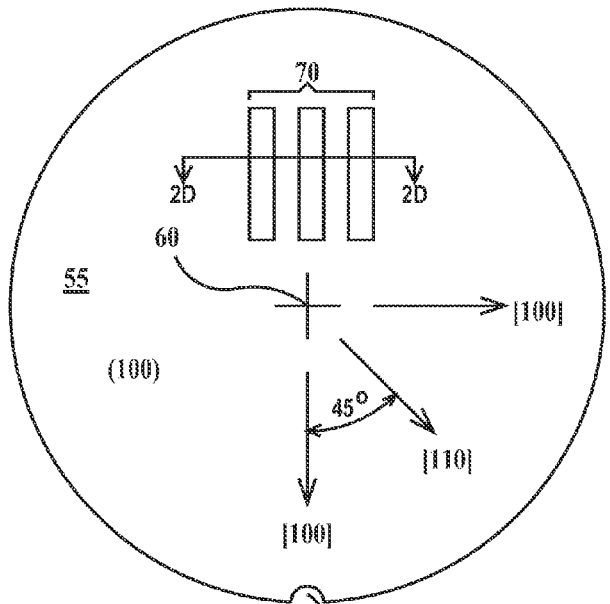
Figure 2D:
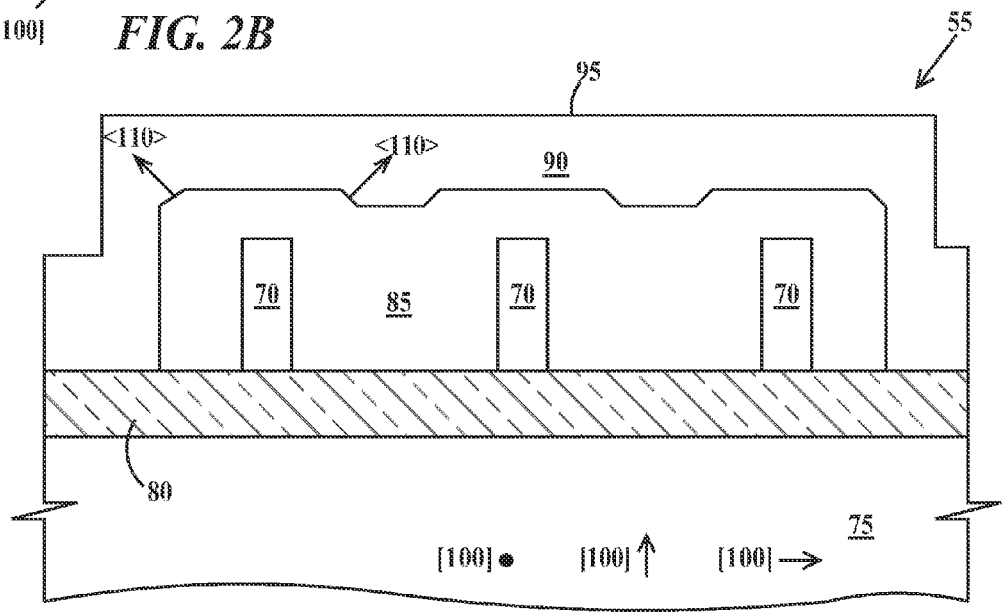

FIGS. 2A through 2D illustrate the crystal orientations of a rotated semiconductor on insulator wafer according to embodiments of the present invention resulting in the complete merging of fins of multi-fin finFETs. FIG. 2A is a top view. In FIG. 2A, a semiconductor wafer 55 has a center 60 and a notch 65. The top surface of wafer 55 is a (100) plane and a line passing through center 60 and notch 65 is along a [100] direction. There are three orthogonal [100] directions, including one into the plane of the drawing. The <110> and <100> directions are 45° apart. Three parallel fins aligned 70 in the [110] direction are illustrated. In FIG. 2B, a [110] direction is indicated as halfway (45°) from a [100] direction and an adjacent [100] direction. In FIG. 2C, fin 70 has a (100) top surface, a {100} sidewall and a longitudinal axis along the <100> direction. The height H of fin 70 is defined by the starting thickness of the upper semiconductor layer, the width W of fin 70 is defined by a combination of photolithography and sidewall spacer technology, and the length L of fin 70 is defined by photolithography. FIG. 2D is a cross-section through line 2D-2D of FIG. 2A. In FIG. 2D, SOI wafer 55 includes a semiconductor substrate layer 75 and an insulating layer 80 between layer 75 and fins 70. Because the top surface of fins 70 are (100) and the sidewalls of fins 25 are {100} there is about the same "up" growth and "side" growth in addition to there being no limiting <111> facet (it is 45° off-axis and has no effect). The <110> facet is weaker facet than the <111>. In FIG. 2D, the initial growth region 85 along grows into the final epitaxial layer 90. In one example, a top surface 95 of final epitaxial layer is smooth and flat. Additionally, the growth in the <100> directions has very few stacking faults. The merged fins (fins 70 and final epitaxial layer 90 do not have (111) facets.

Figure 3:
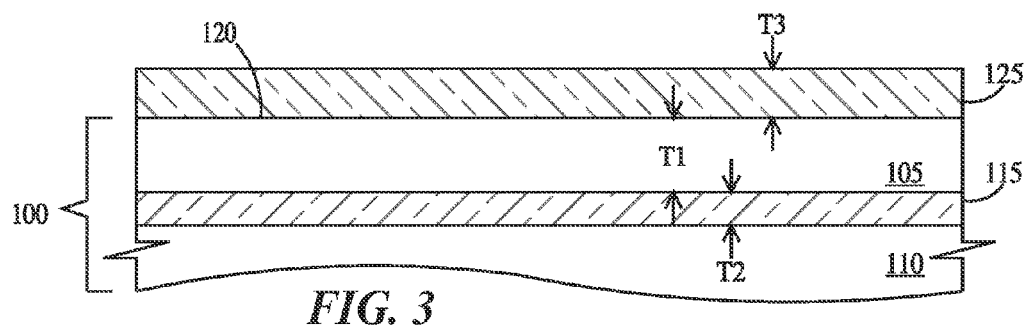
FIGS. 3 through 16 illustrate fabrication of finFETs according an exemplary embodiment of the present invention.
Figure 19:
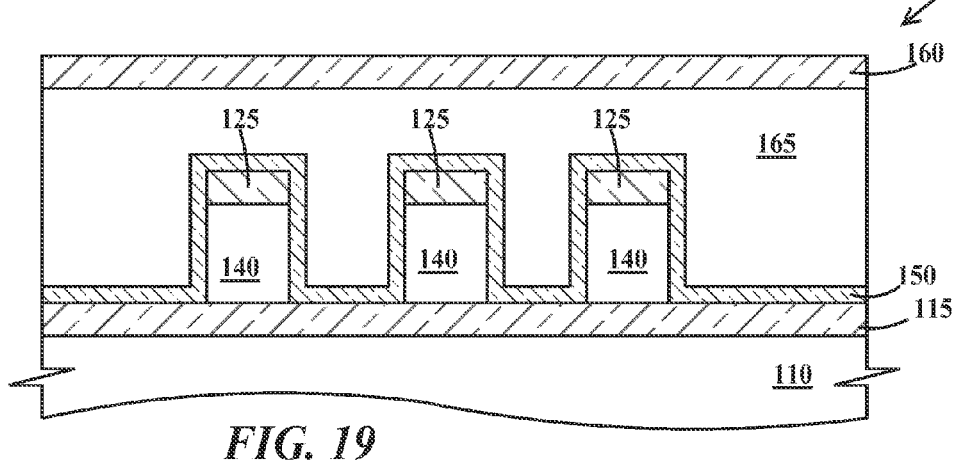

FIGS. 3 through 16 illustrate fabrication of finFETs according to embodiments of the present invention. FIG. 3 is a cross-sectional view of a starting substrate for fabrication of a merged fin finFET. In FIG. 3, an SOI substrate 100 includes a single-crystal silicon layer 105 separated from a supporting single-crystal silicon substrate 110 by a buried oxide (BOX) layer (or insulating layer) 115. Formed on a top surface 120 of silicon layer 105 is an optional dielectric capping layer 125A. Top surface 120 of silicon layer 105 is coplanar with a {100} crystal plane of silicon layer 105. SOI substrate 100 is typically in the form of thin disk called a wafer, having typical diameters of 100 mm, 200 mm and 300 mm and between about 200 microns to about 750 microns thick. Silicon layer 105 has a thickness T1. In one example, T1 is between about 5 nm and about 100 nm. BOX layer 115 has a thickness T2. In one example, T2 is between about 20 nm and about 40 nm, with about 25 nm preferred. In conventional SOI substrates the BOX layer is about 145 nm or more thick. The relative thinness of BOX layer 115 maximizes desirable fin merge by vertical epitaxial growth from substrate 110 while minimizing undesirable fin-merge by horizontal epitaxial from the sides of the fins as illustrated in FIG. 19 and described infra. Capping layer 125A has a thickness T3. In one example, T3 is between about 0 nm and about 200 nm. In one example, capping layer 125A comprises silicon nitride. When capping layer 125A is present, the resultant finFET will be dual-gated (the gate will be formed on gate dielectric on opposite sidewalls of the fin). When capping layer 125A is not present, the resultant finFET will be tri-gated (the gate will be formed on gate dielectric on opposite sidewalls of the fin and on the gate dielectric on the top surface of the fin).

Figure 4:
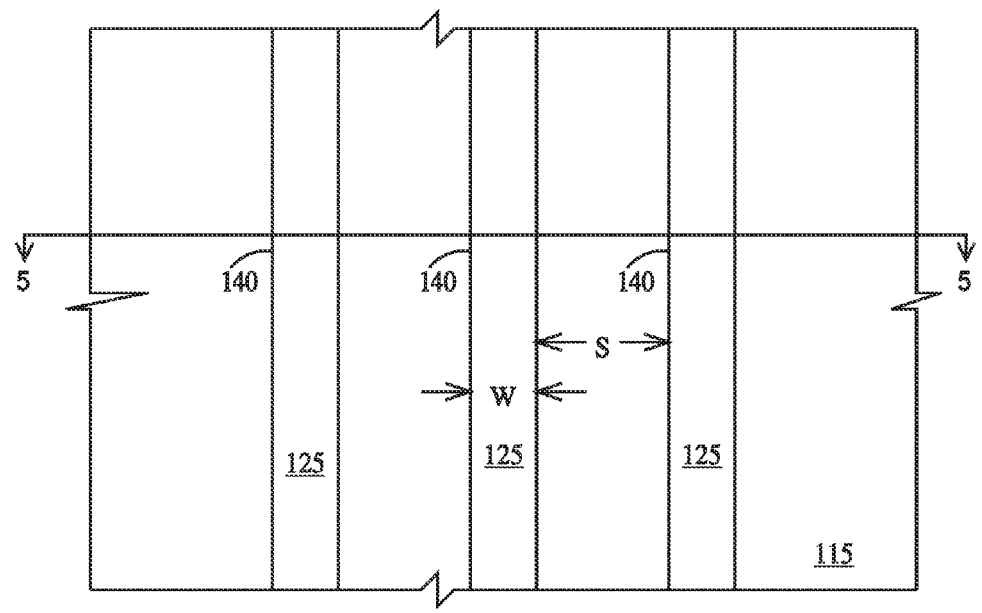
Figure 5:
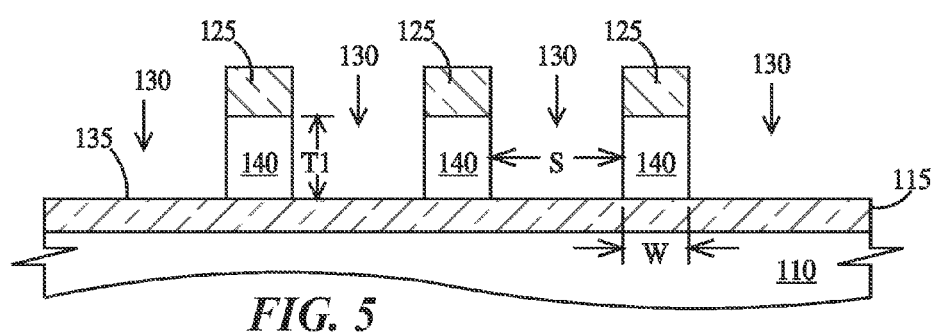

FIG. 4 is a top view and FIG. 5 is a cross-sectional view through line 3-3 of FIG. 4. In FIGS. 4 and 5, trenches 130 have been etched through capping layer 125 and silicon layer 105 (see FIG. 3) down to a top surface 135 of BOX layer 115 to define fins 140 capped by dielectric caps 125. Each of fins 140 is a rectangular block of silicon. Fins 140 have a height T1, a width W and are spaced apart a distance S. In one example, W is between about 5 nm and about 40 nm. In one example, S is between about 8 nm and about 30 nm. In one example, W and S are independently about 30 nm or less. In one example, W and S are the same and about 30 nm or less.

Figure 6:
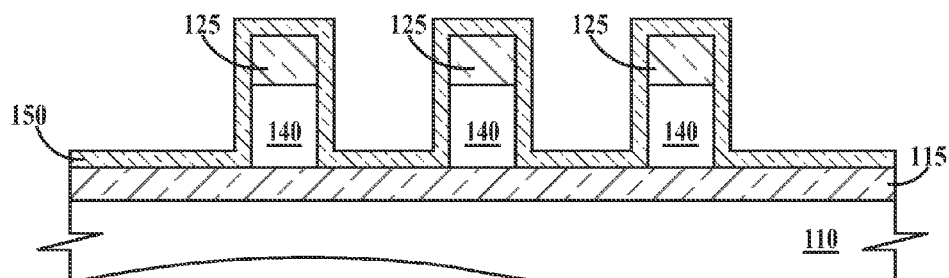

In FIG. 6 a conformal gate dielectric layer 150 is formed on all exposed surfaces of BOX layer 115, fins 140 and dielectric caps. In one example, gate dielectric layer 150 is a high dielectric constant (k) material, examples of which include but are not limited metal oxides such as $Ta_2O_5$, $BaTiO_3$, $HfO_2$, $ZrO_2$, $Al_2O_3$, or metal silicates such as $HfSi_xO_y$ or $HfSi_xO_yN_z$ or combinations thereof. A layer of $HfO_2$ is preferred. A high K dielectric material has a relative permittivity above about 10. In one example, gate dielectric layer 150 is about 0.5 nm to 20 nm thick.

Figure 7:
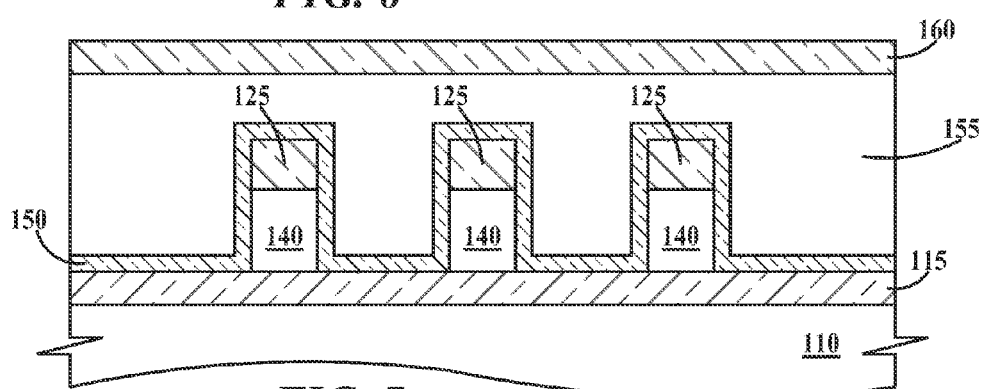

In FIG. 7, a blanket polysilicon layer 155 has been deposited (e.g., by a chemical-vapor deposition (CVD)) on gate dielectric layer 150. Polysilicon layer 155 may be doped (P-type for a P channel-finFET, N-type for an N channel-finFET) or undoped. Then a hardmask layer 160 is formed in the top surface of polysilicon layer 155.

Figure 8:
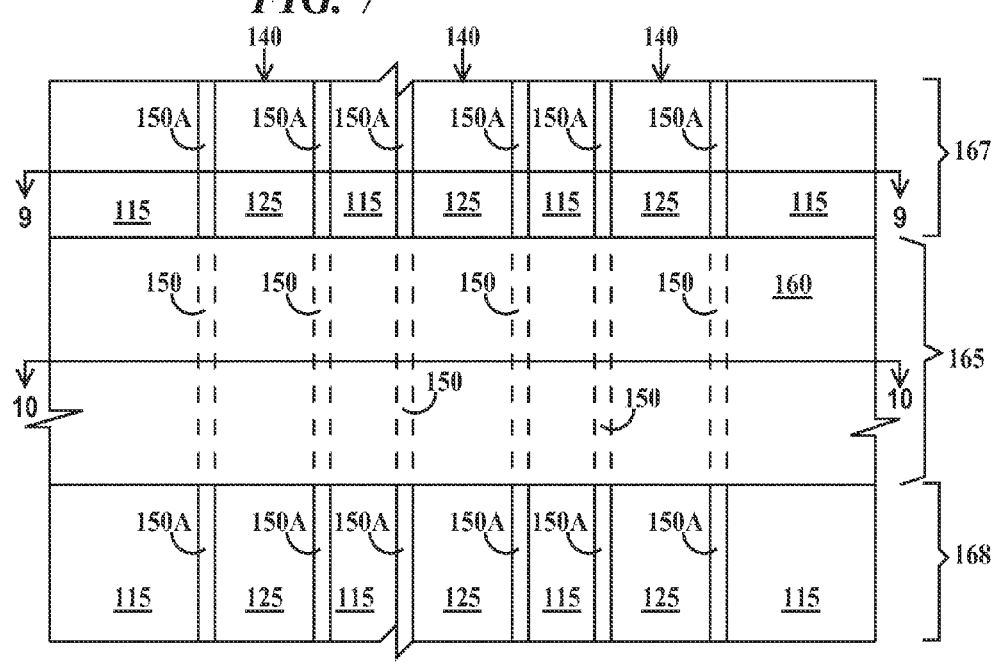
Figure 9:
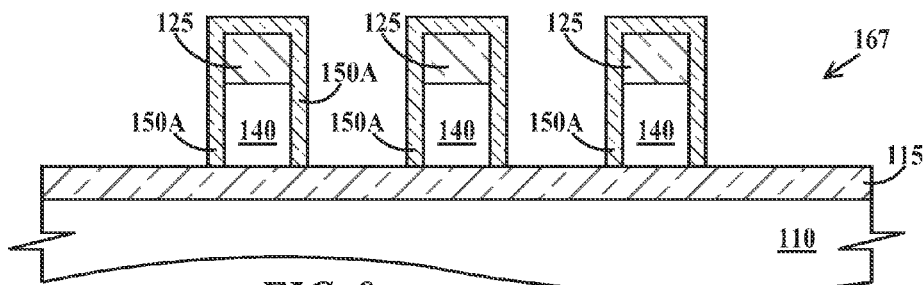
Figure 10:
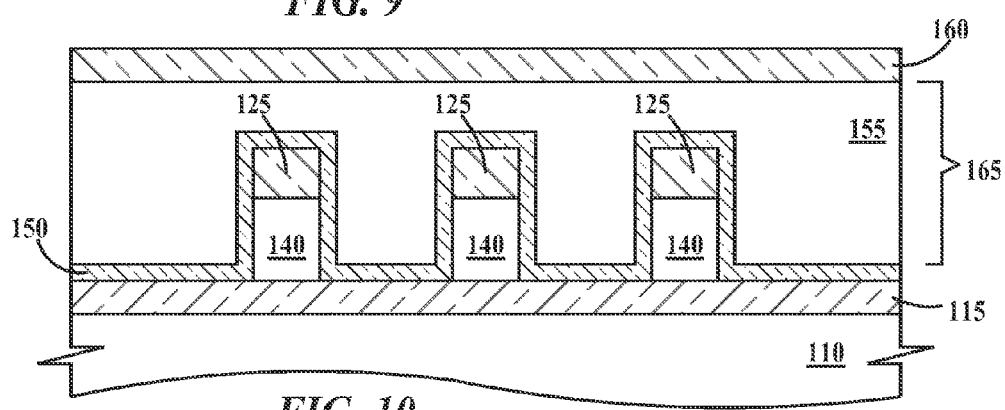

FIG. 8 is a top view, FIG. 9 is a cross-section view through line 9-9 of FIG. 8 and FIG. 10 is a cross-section view through line 10-10 of FIG. 8 after a photolithographic/etch process to define an electrically conductive gate 165 by selective removal of hardmask layer 160 and polysilicon layer 155 (see FIG. 7) in regions 167 and 168 on opposite sides of gate electrode 165. In FIG. 9, region 167 is illustrated. Region 168 (see FIG. 8) would be similar. In FIG. 10, hardmask layer 160 remains over gate electrode 165. In the example of FIG. 10, gate electrode 165 is formed over both sides and the top of fins 140, but dielectric caps 125 are thick enough so no channel can form along the top surfaces of the fins when voltage is applied to the gate. Individual fins will be dual-gated. However, if dielectric caps 125 are not present gate dielectric layer 150 will be formed on the top surface of fins 140.

Figure 11:
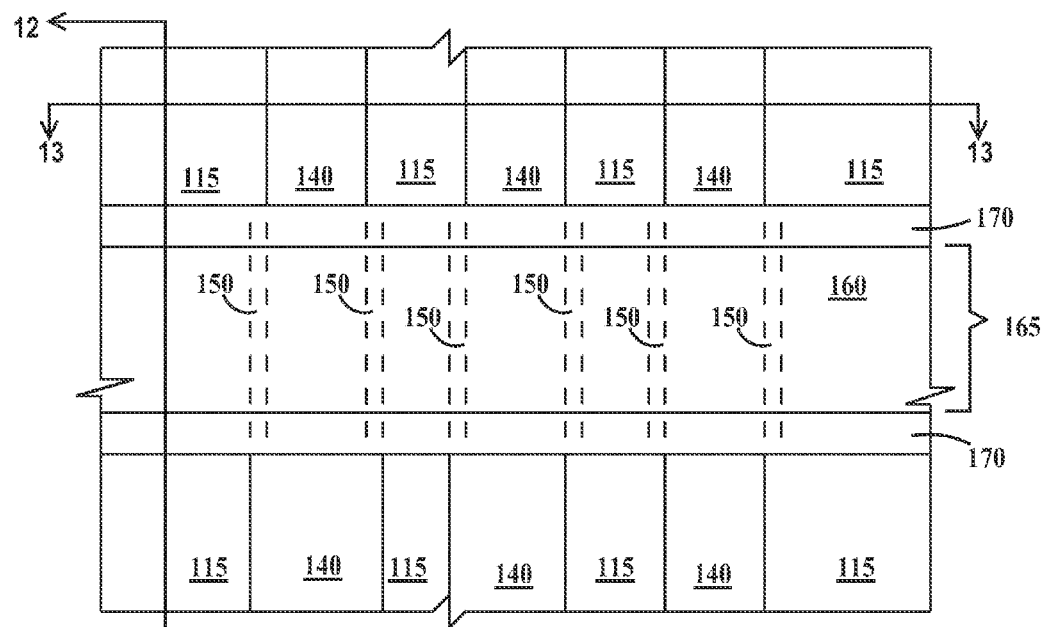
Figure 12:
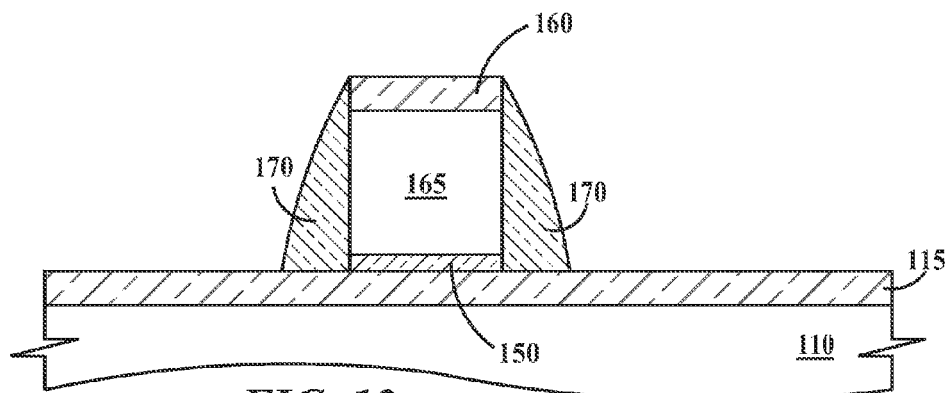
Figure 13:
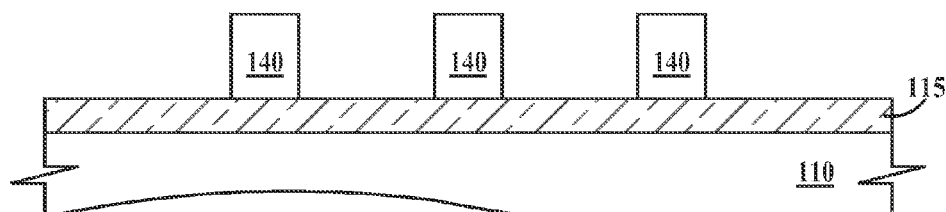

FIG. 11 is a top view, FIG. 12 is a cross-section view through line 12-12 of FIG. 11 and FIG. 13 is a cross-section view through line 13-13 of FIG. 11 after formation of dielectric sidewall spacers 170 on the sidewalls of gate electrode 165 as illustrated in FIG. 12. Sidewall spacers 170 may be formed by blanket deposition of a conformal layer on the structures of FIG. 8 and performing an anisotropic etch such as a reactive ion etch (RIE). After or during formation of sidewall spacers 170, gate dielectric layer 125 and capping layer 125 (see FIG. 9) are removed those regions of fins 140 under gate electrode 165 or sidewall spacers 170 as illustrated in FIG. 13.

Figure 14:
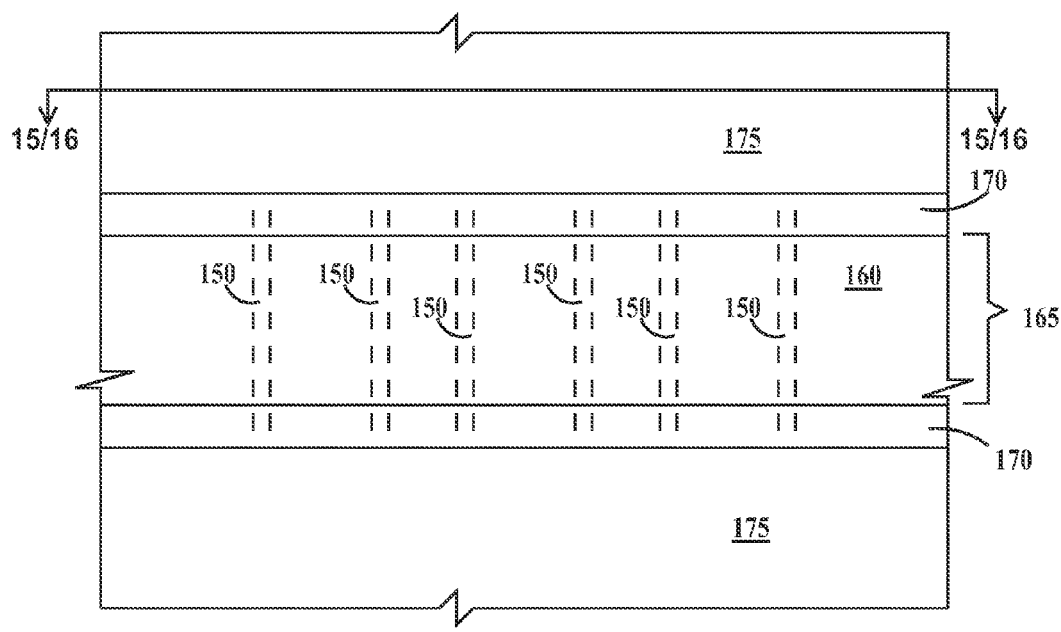
Figure 15:
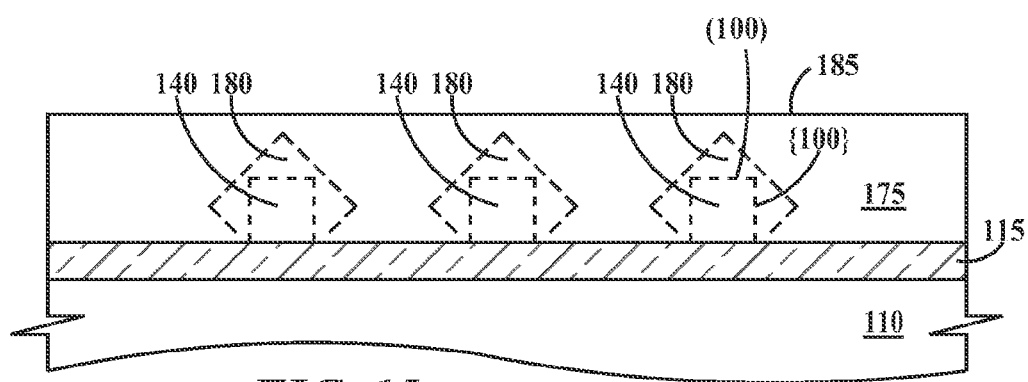
Figure 16:
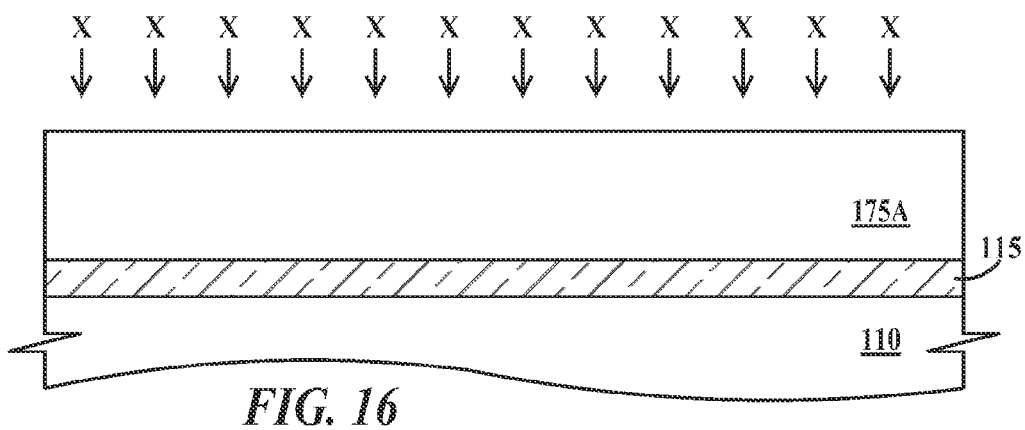

FIG. 14 is a top view, and FIGS. 15 and 16 are cross-section views through line 15/16-15/16 of FIG. 14. In FIG. 15, merged source/drains 175 are formed by epitaxial silicon, silicon-germanium or carbon-doped silicon growth from the exposed surfaces of fins 140. Epitaxial silicon or silicon-germanium growth occurs faster from {100} plane surfaces than from {110} plane surfaces. Also, there are less crystal lattice irregularities in silicon, silicon-germanium or carbon-doped silicon grown from {100} plane surfaces than from {110} plane surfaces. Through not shown in FIG. 14, epitaxial silicon, silicon-germanium or carbon-doped silicon growth also occurs from the now exposed ends of fins 140 which surfaces are coplanar with a {100} crystal plane. In FIG. 15, fins 140 are represented by dashed lines and the (100) surfaces are indicated. Initial epitaxial growth 180 is represented by the larger dashed lines. Growth continues until fins 140 merge into merged source drain 175. The top surface 185 is unexpectedly flat and parallel to top surface of substrate 100 (see FIG. 3). In FIG. 16 an optional ion implantation of dopant species X is performed in to form doped merged source/drains 175A from merged source/drains 175 of FIG. 15. For an NFET, dopant species X is an N-type dopant such as arsenic or phosphorous. For a PFET, dopant species X is an P-type dopant such as boron.

Figure 17:
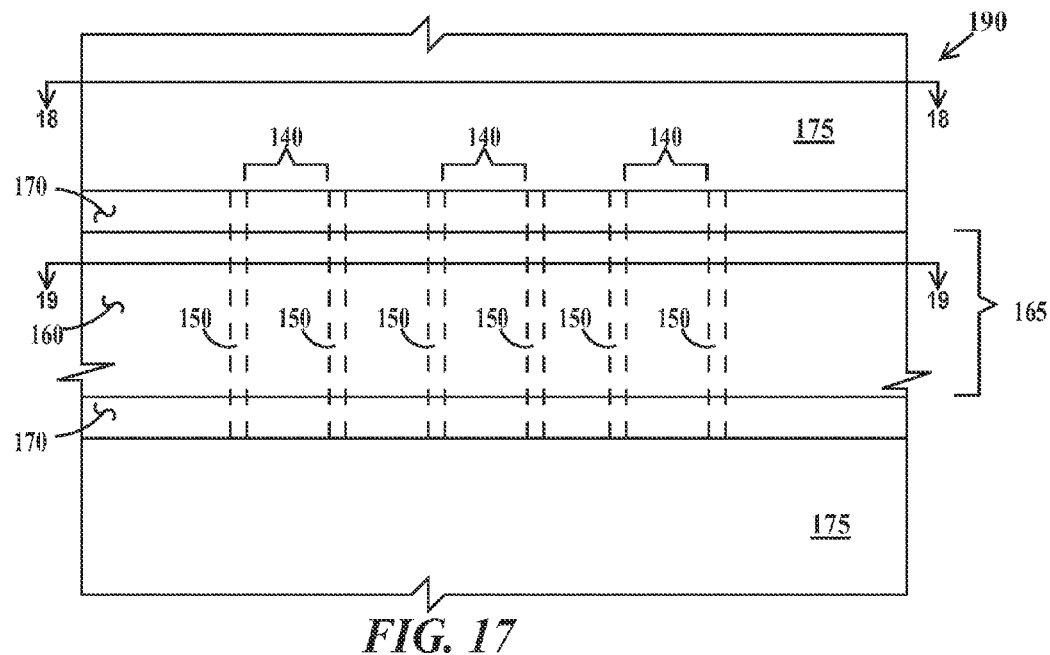
FIGS. 17 through 19 illustrate a first merged fin finFET according to embodiments of the present invention.
Figure 18:
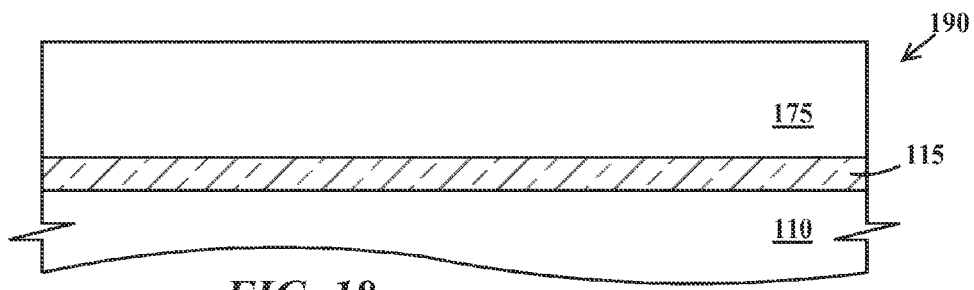

FIGS. 17 through 19 illustrate a first merged fin finFET according to embodiments of the present invention. FIG. 17 is a top view, FIG. 18 is a cross-section view through line 18-18 of FIG. 17 and FIG. 19 is a cross-section view through line 19-19 of FIG. 17 of a merged source/drain SOI finFET 190. Fins 140 and gate dielectric layer 150 are under gate electrode 165 and sidewall spacers 170 and merged source/drains 175 abut sidewall spacers 170. Alternatively, regions of fins 140 may intervene between merged fins 175 and spacers 170. This may be accomplished by removing gate dielectric layer 150 and capping layer 125 from only the ends of the fins prior to epitaxial growth of FIG. 15.

Figure 20:
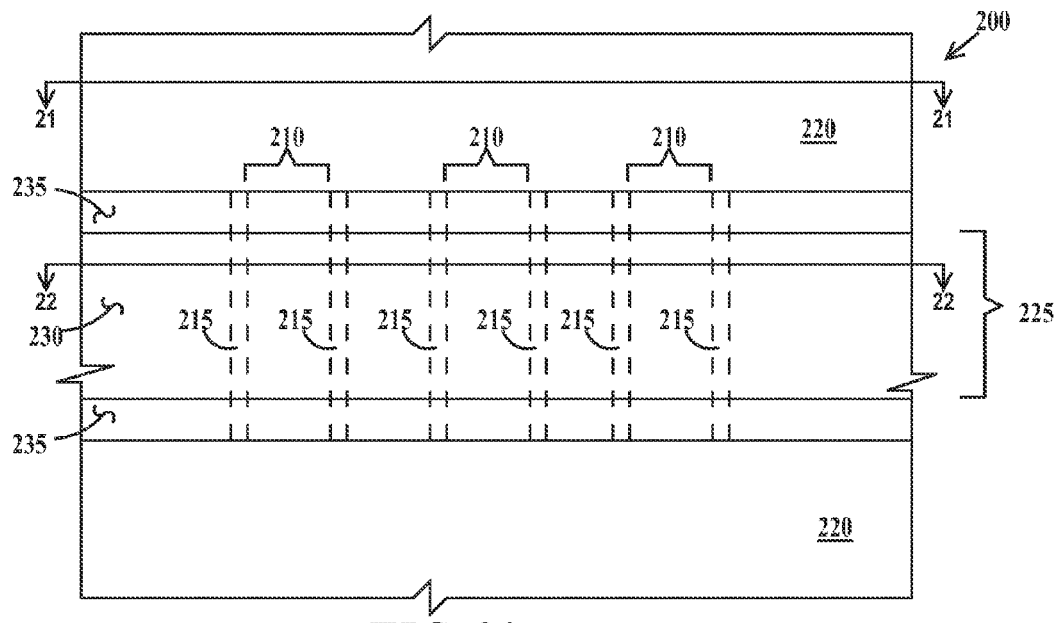
FIGS. 20-22 illustrate a second merged fin finFET according to embodiments of the present invention.
Figure 21:
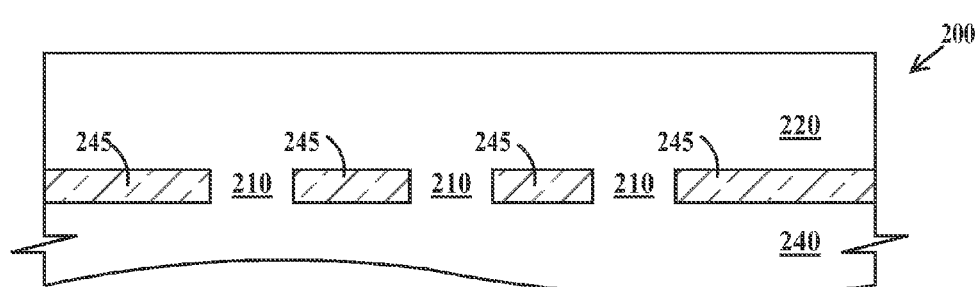
Figure 22:
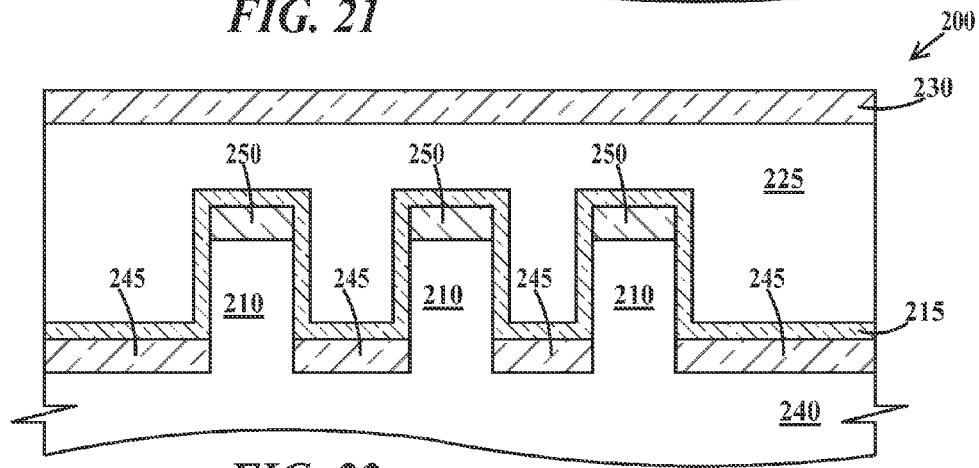

FIGS. 20-22 illustrate a second merged fin finFET according to embodiments of the present invention. FIG. 20 is a top view, FIG. 21 is a cross-section view through line 21-21 of FIG. 20 and FIG. 22 is a cross-section view through line 22-22 of FIG. 20 of a merged source/drain bulk silicon finFET 200. FinFET 200 is fabricated in a similar manner as finFET 190 of FIGS. 17, 18 and 19. Fins 210 and gate dielectric layer 215 are under gate electrode 225 and sidewall spacers 235 and merged source/drains 220 abut sidewall spacers 235. The main difference between finFET 200 and finFET 190 of FIGS. 17, 18 and 19, is the fins of finFET 190 are formed on top of a BOX layer and are insulated from the underlying substrate, while the fins of finFET 200 are contiguous with single-crystal silicon substrate 240 through trenches in dielectric layer 245.

Thus, the embodiments of the present invention provide finFETs and method of making finFETs with decreased parasitic resistance and more uniform fin merging as the fin width and spacing is scaled down.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:
1. A method, comprising:
(a) forming two or more fins on a top surface of an insulating layer on semiconductor substrate, each fin of said two or more fins being a solid rectangular block of single-crystal semiconductor material, each fin of said two or more fins having a central region between and abutting first and second end regions and opposite sides, top surfaces and sidewalls of said two or more fins are (100) surfaces and the longitudinal axes of said two or more fins aligned with a [100] direction;
after (a), (b) forming a gate dielectric layer on each fin of said two or more fins;
after (b), (c) forming an electrically conductive gate over said gate dielectric layer over said central region of each fin of said of two or more fins;
after (c), (d) removing said gate dielectric layer from at least one end region of each fin of said two or more fins to form exposed end regions of each fin of said two or more fins, said exposed end regions on the same side of said conductive gate; and
after (d), (e) growing an epitaxial semiconductor material on said exposed ends of each fin of said two or more fins to form a merged source/drain comprising said exposed ends of said two or more fins and said epitaxial semiconductor material, wherein said a top surface of said merged source/drain has no (111) facets formed during said growing of said epitaxial semiconductor material.

2. The method of claim 1, wherein said two or more fins are formed from an upper single-crystal semiconductor layer of a semiconductor on insulator wafer comprising said insulating layer between said semiconductor substrate and said upper single-crystal semiconductor layer.

3. The method of claim 2, wherein a line passing through a notch in the edge of said semiconductor on insulator wafer and the center of semiconductor on insulator wafer is aligned a [100] crystal direction of said upper single-crystal semiconductor layer.

4. The method of claim 2, further including:
patterning said upper single-crystal semiconductor layer into said two or more fins.

5. The method of claim 2, wherein said upper single-crystal semiconductor layer is selected from the group consisting of a layer of Si, a layer of SiGe, and a layer of Si:C.

6. The method of claim 2, wherein said semiconductor substrate and said upper single-crystal semiconductor layer are both Si and said epitaxial semiconductor material is SiGe.

7. The method of claim 2, wherein said semiconductor substrate and said upper single-crystal semiconductor layer are both Si and said epitaxial semiconductor material is selected from the group consisting of Si, SiGe, and Si:C.

8. The method of claim 1, wherein said gate dielectric comprises material having a relative permittivity above about 10 and selected from the group consisting of metal oxides, $Ta_2O_5$, $BaTiO_3$, $HfO_2$, $ZrO_2$, $Al_2O_3$, metal silicates, $HfSi_xO_y$ or $HfSi_xO_yN_z$ and combinations thereof.

9. The method of claim 1, further including:
between (a) and (b) forming a dielectric cap on top surfaces of each fin of said two or more fins;
wherein (b) includes forming said gate dielectric layer on said dielectric cap; and
wherein (d) includes removing said dielectric cap from said at least one end region of each fin of said two or more fins.

10. The method of claim 1, further including:
after (d), ion implanting a dopant species into said merged source/drain.

11. The method of claim 1, wherein said two or more fins each have a width of about 30 nm or less.

12. The method of claim 1, wherein a top surface of said merged source/drain is smooth and uniform and has no divots.

13. The method of claim 1, further including:
forming a dielectric cap on top surfaces of each fin of said two or more fins before forming said gate dielectric layer.

* * * * *